United States Patent
Andrea et al.

(10) Patent No.: US 12,260,162 B2
(45) Date of Patent: Mar. 25, 2025

(54) METHOD AND APPARATUS FOR PRINTING ELECTRICAL CIRCUIT DIRECTLY ON TARGET SURFACE HAVING 3-DIMENSIONAL SHAPE, 3D PRINTER USED FOR THE SAME AND ELECTRICAL DEVICE HAVING ELECTRICAL CIRCUIT PRINTED BY THE SAME

(71) Applicant: KAIST (Korea Advanced Institute of Science and Technology), Daejeon (KR)

(72) Inventors: Bianchi Andrea, Daejeon (KR); Neung Ryu, Daejeon (KR); Youngkyung Choi, Daejeon (KR); Myung Jin Kim, Daejeon (KR); Artem Dementyev, Daejeon (KR)

(73) Assignee: KAIST (KOREA ADVANCED INSTITUTE OF SCIENCE AND TECHNOLOGY), Daejeon (KR)

( * ) Notice: Subject to any disclaimer, the term of this patent is extended or adjusted under 35 U.S.C. 154(b) by 590 days.

(21) Appl. No.: 17/577,081

(22) Filed: Jan. 17, 2022

(65) Prior Publication Data
US 2022/0229967 A1 Jul. 21, 2022

(30) Foreign Application Priority Data
Jan. 15, 2021 (KR) .................. 10-2021-0006204

(51) Int. Cl.
*G06F 30/392* (2020.01)
*H05K 3/12* (2006.01)

(52) U.S. Cl.
CPC .......... *G06F 30/392* (2020.01); *H05K 3/125* (2013.01); *H05K 3/1275* (2013.01)

(58) Field of Classification Search
USPC ...................... 716/54, 110, 111, 1, 119, 137
See application file for complete search history.

(56) References Cited

U.S. PATENT DOCUMENTS

2021/0333131 A1* 10/2021 Gumennik ......... G01D 5/35354

FOREIGN PATENT DOCUMENTS

| CN | 109732900 A | * | 5/2019 |
| JP | 2000305279 A | * | 11/2000 |

* cited by examiner

*Primary Examiner* — Brian Ngo
(74) *Attorney, Agent, or Firm* — LEX IP MEISTER, PLLC

(57) ABSTRACT

A method and apparatus for printing an electric circuit directly on a target surface having a three-dimensional shape are provided. In this method, a 3D printing apparatus that can be attached to a target surface is used. In this printing method, two-dimensional information about the shape of the electric circuit to be printed and information about the three-dimensional shape of the target surface are input. Two-dimensional information about the shape of the electric circuit to be printed is adjusted based on the information about the three-dimensional shape of the target surface to generate three-dimensional information about the electric circuit to be printed. Based on this, a tool path for controlling the 3D printing apparatus is generated.

An electric circuit can be directly fabricated on a target surface having a three-dimensional shape by the method and apparatus. In addition, an electronic device having a three-dimensional electric circuit manufactured by the present method can be applied in various ways.

11 Claims, 25 Drawing Sheets

[Fig. 1]
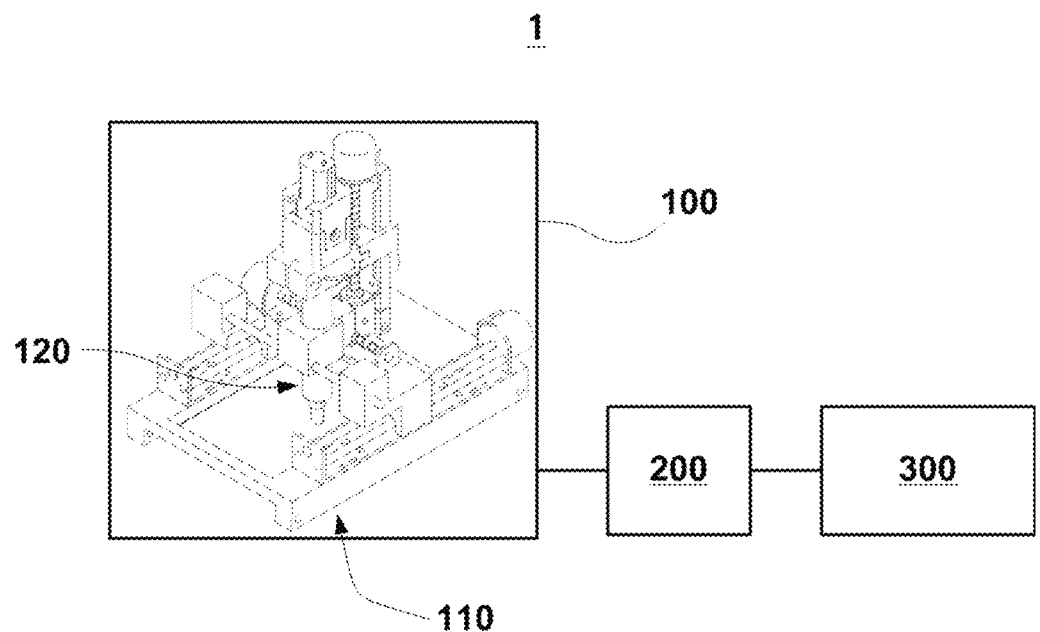

[Fig. 2]
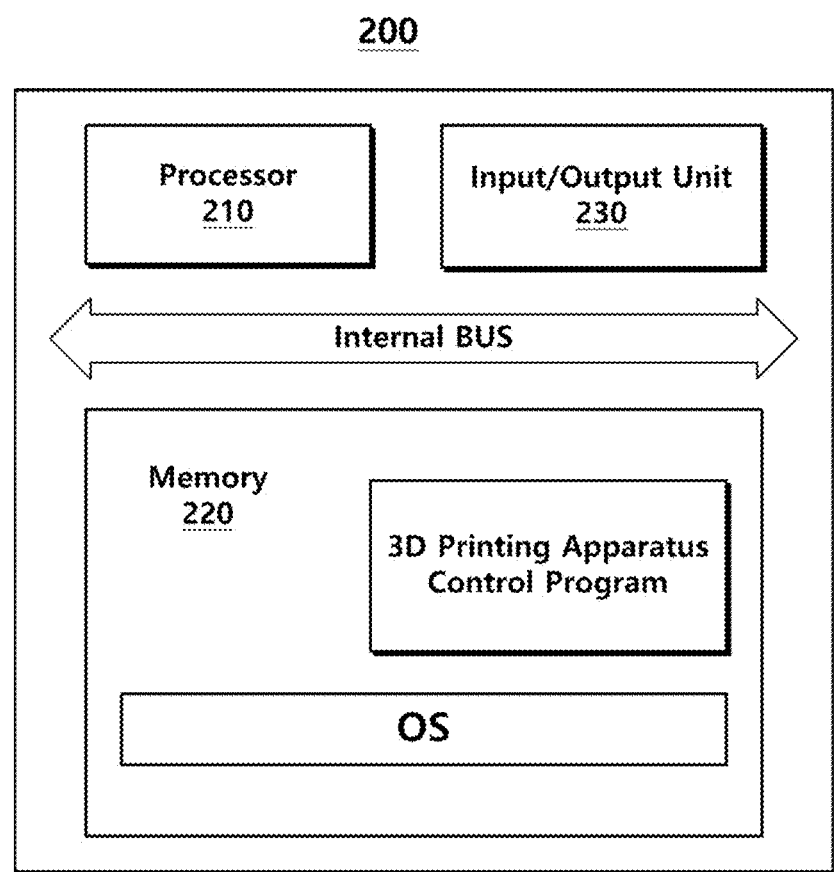

[Fig. 3]
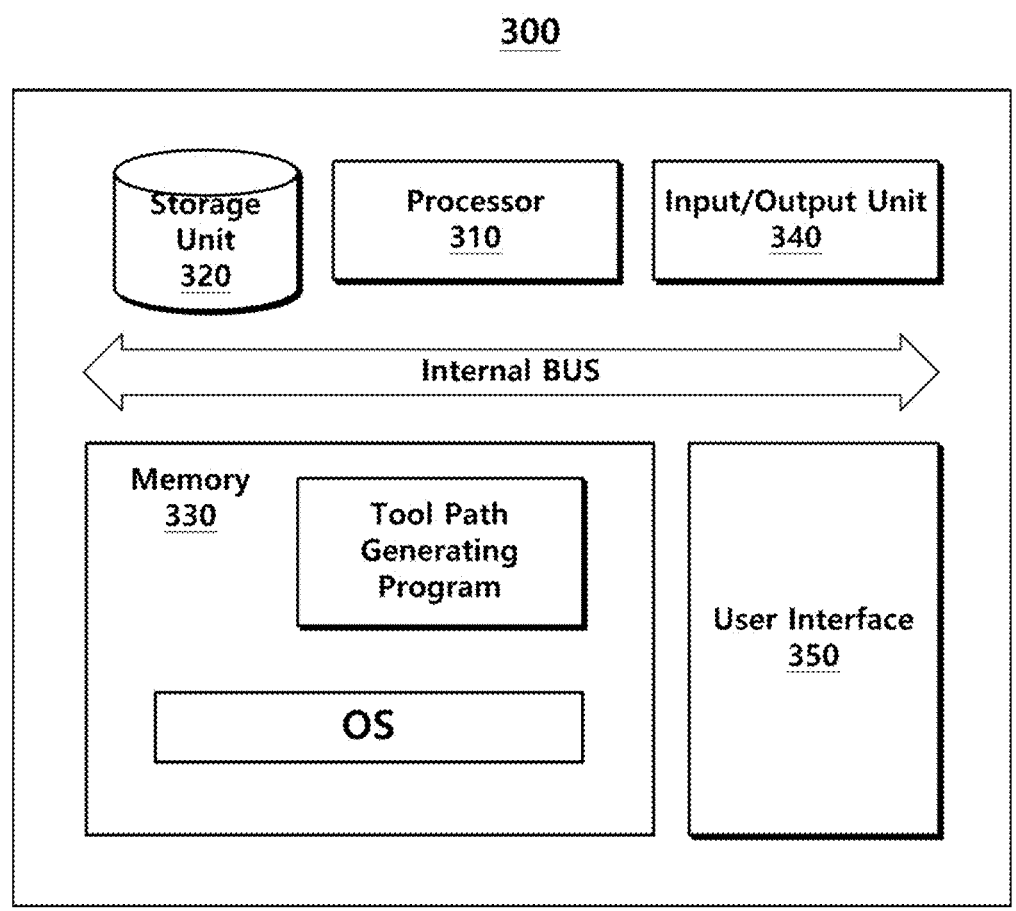

[Fig. 4]
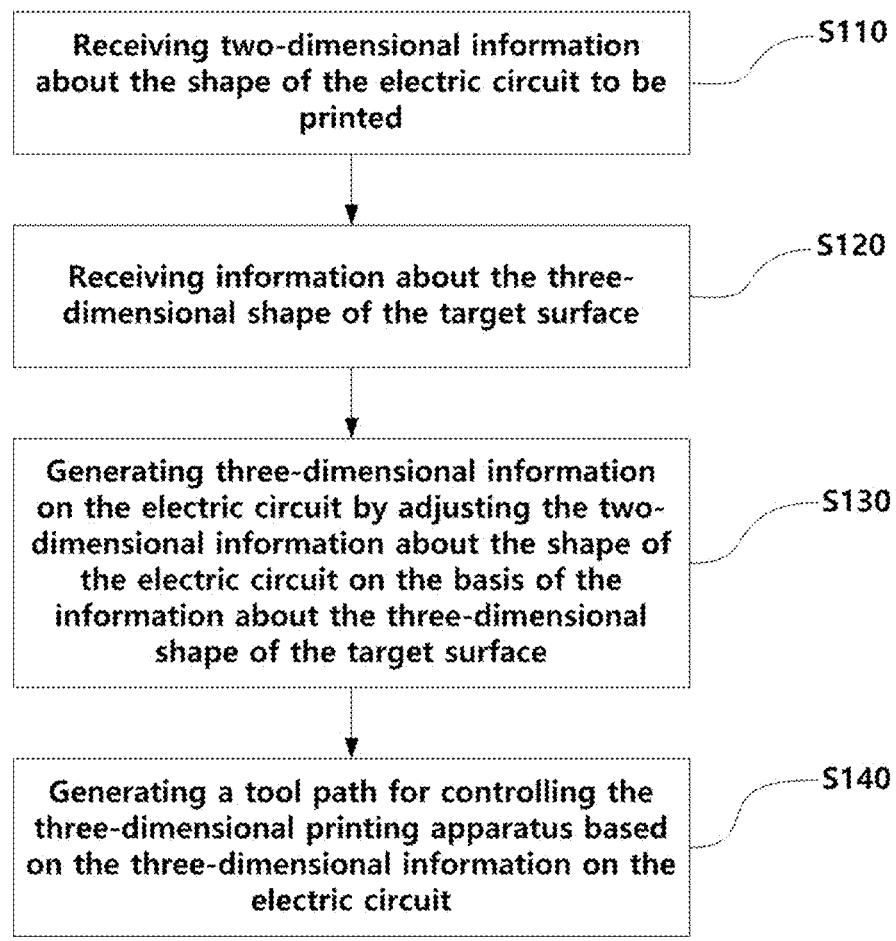

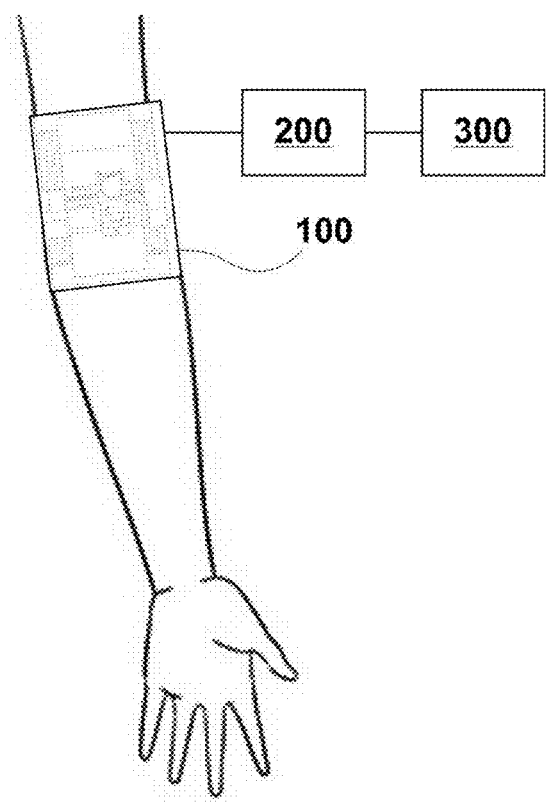
[Fig. 5]

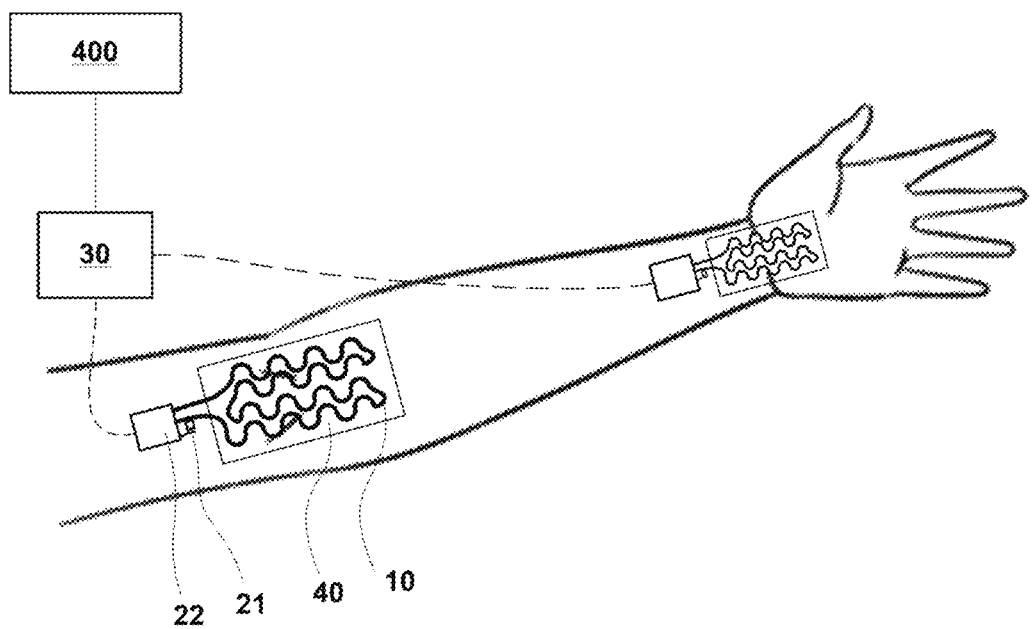
[Fig. 6]

[Fig. 7]
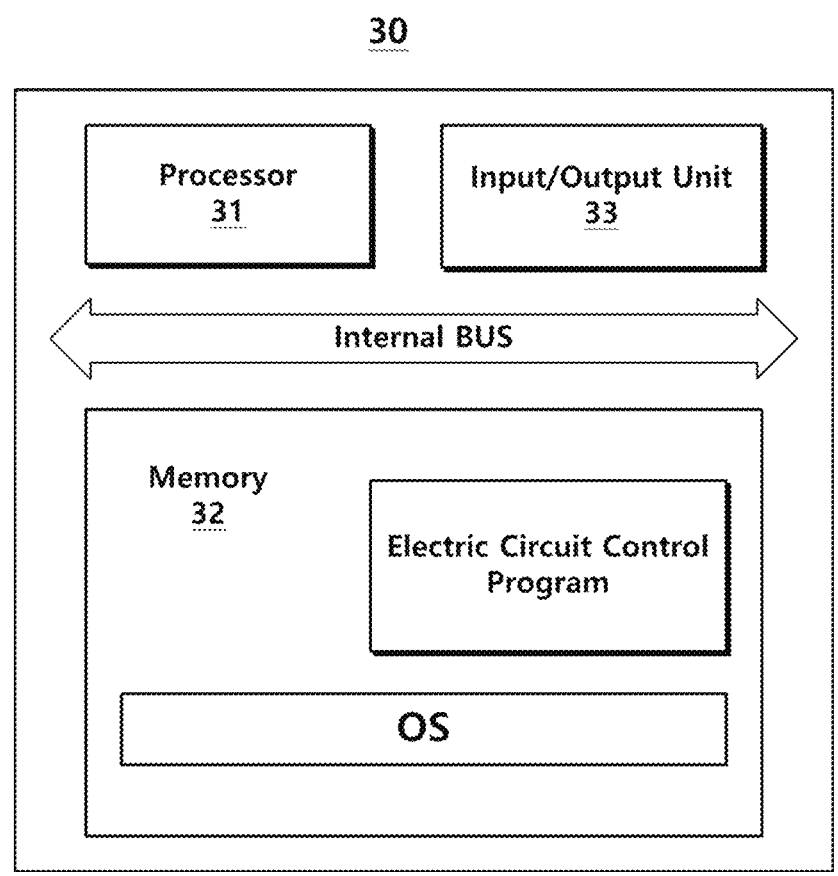

[Fig. 8]
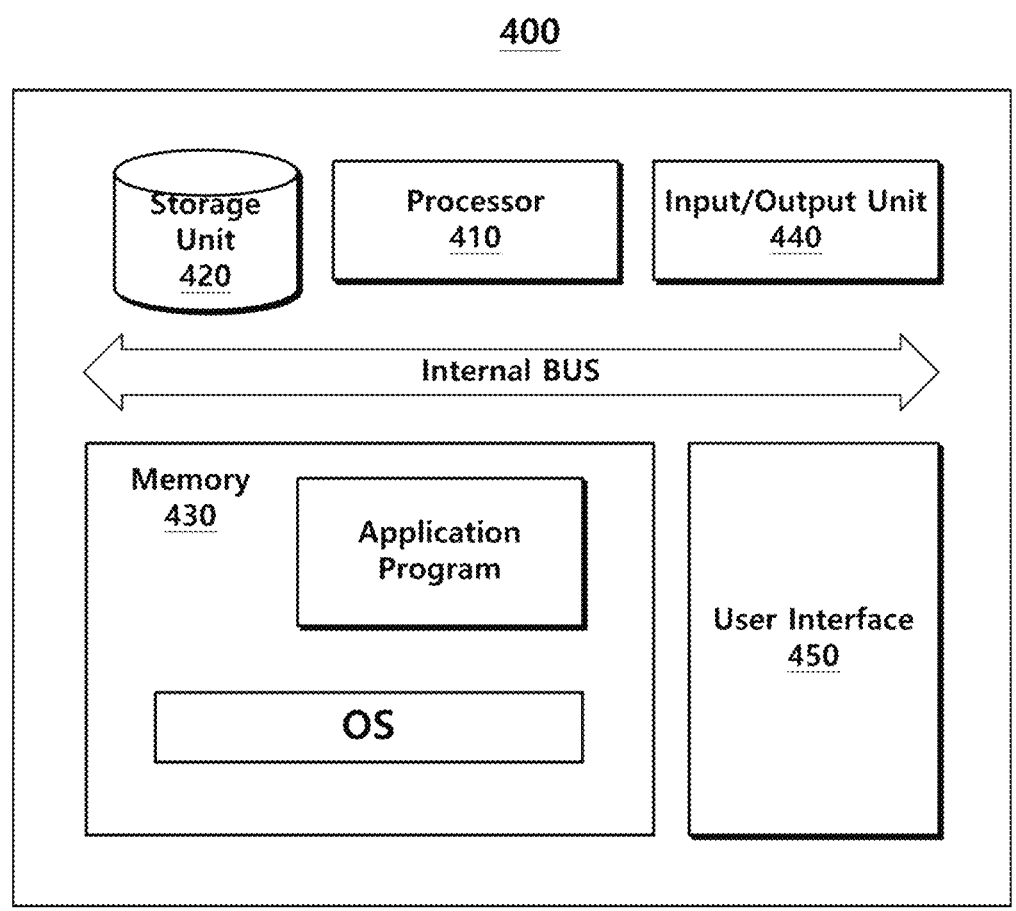

[Fig. 9A]
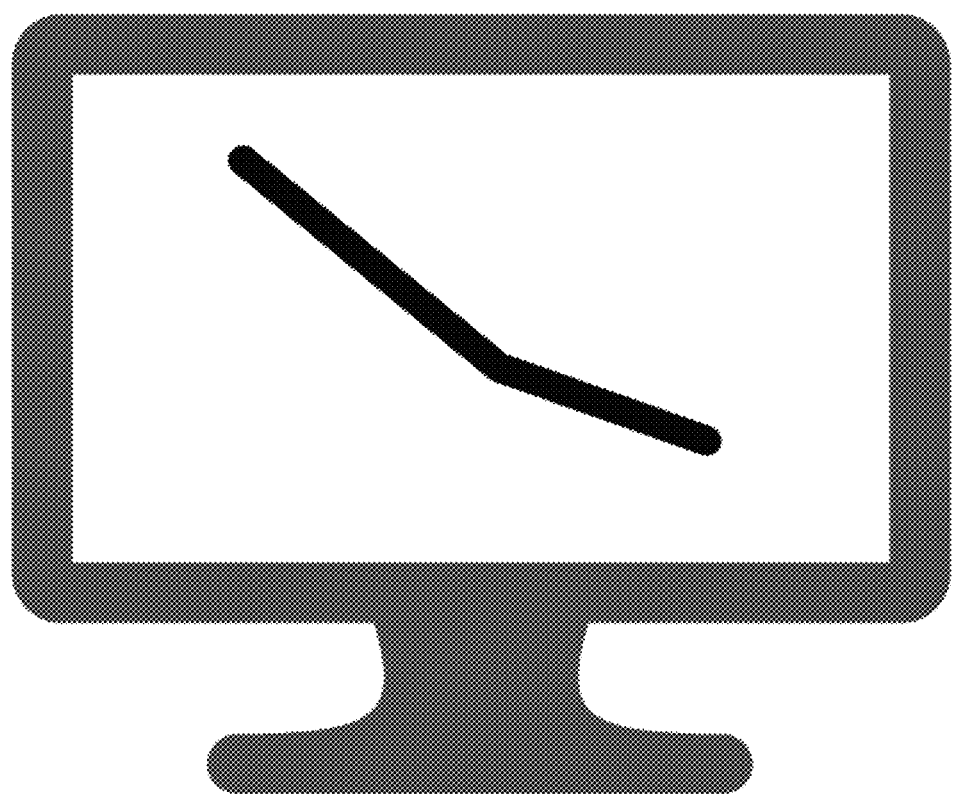

[Fig. 9B]
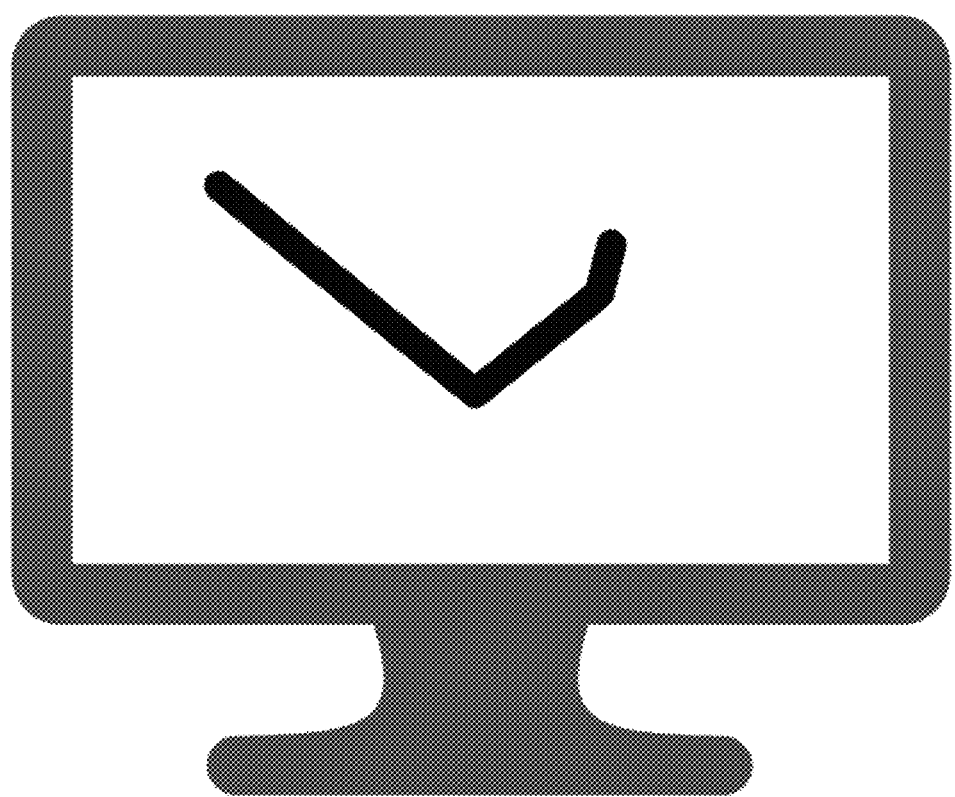

[Fig. 10]
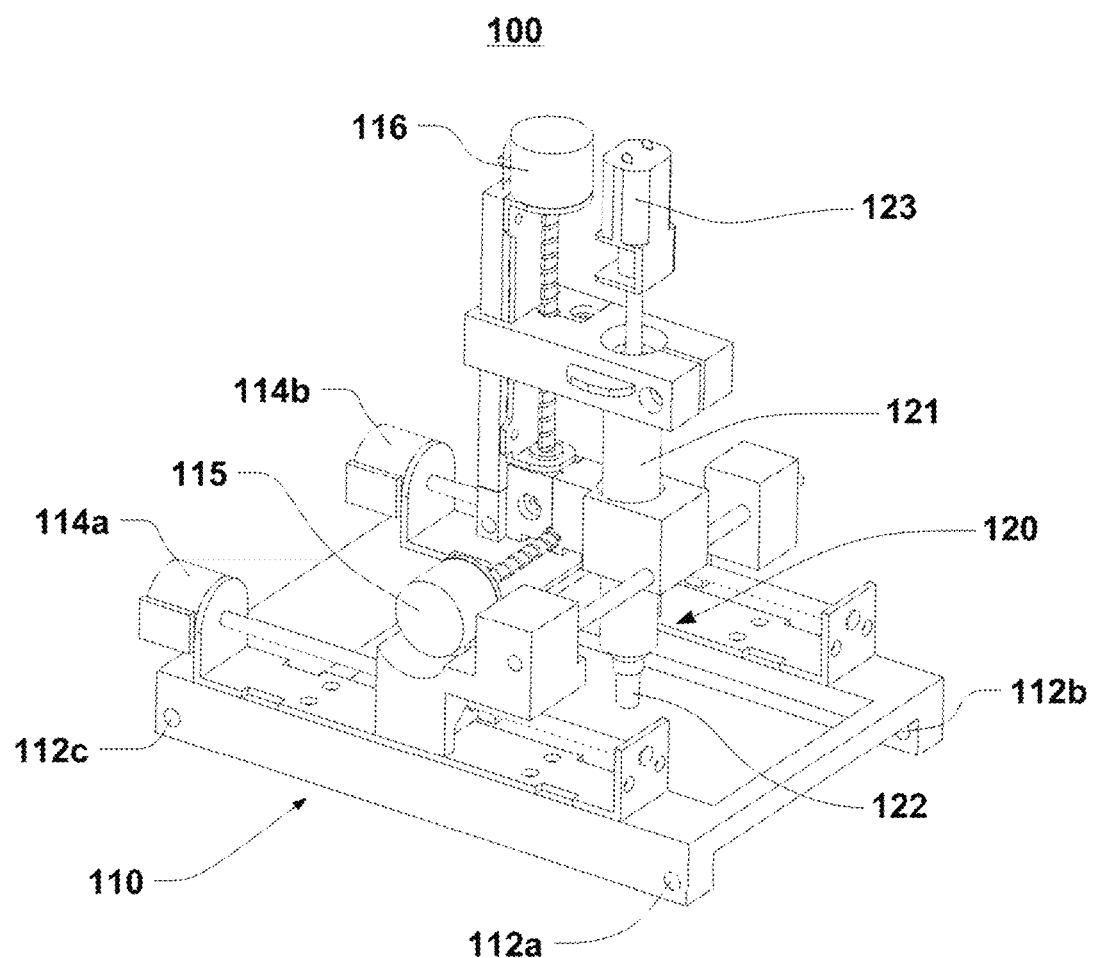

[Fig. 11]
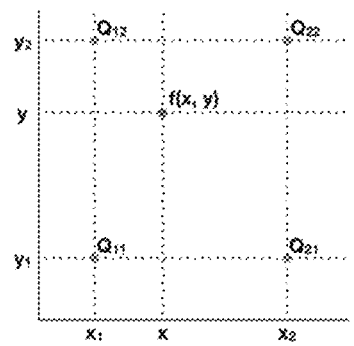
$$f(x,y) = \frac{1}{(x_2 - x_1)(y_2 - y_1)} \begin{vmatrix} x_2 - x & x - x_1 \end{vmatrix}$$
$$\times \begin{vmatrix} f(Q_{11}) & f(Q_{12}) \\ f(Q_{21}) & f(Q_{22}) \end{vmatrix} \begin{vmatrix} y_2 - y \\ y - y_1 \end{vmatrix}$$

[Fig. 12A]
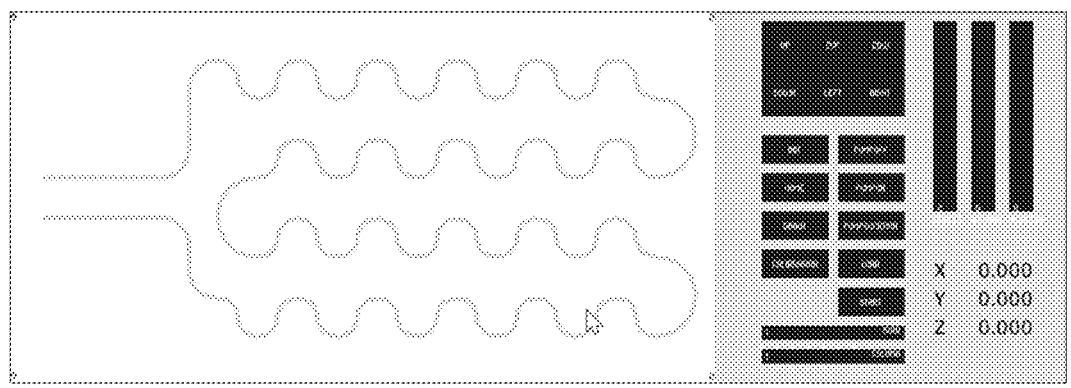
[Fig. 12B]
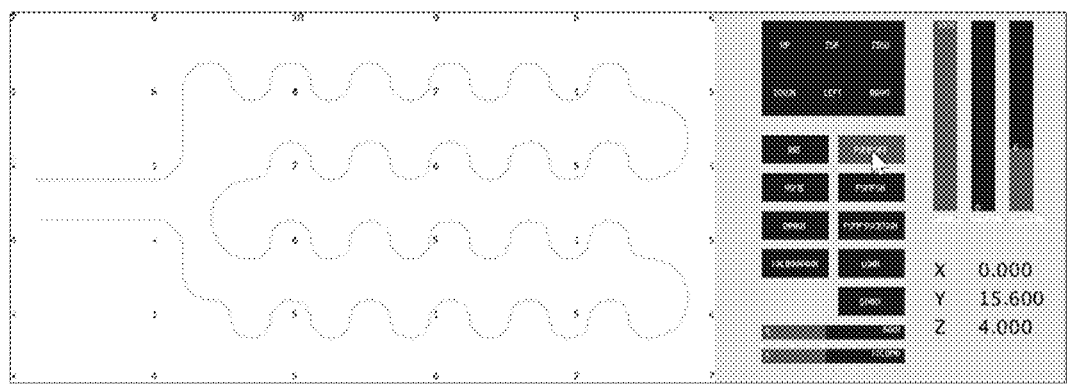

[Fig. 13]
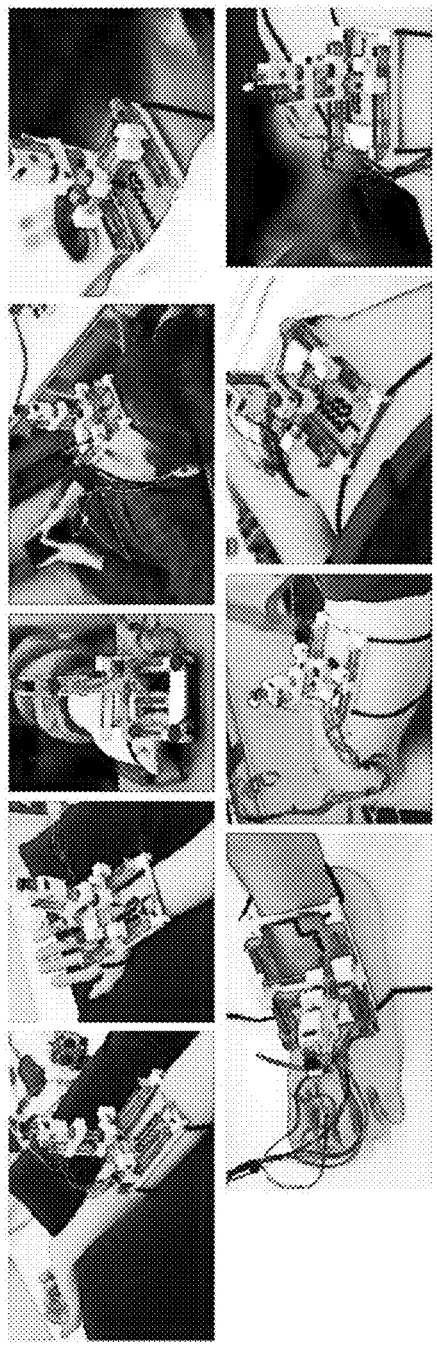

[Fig. 14A]
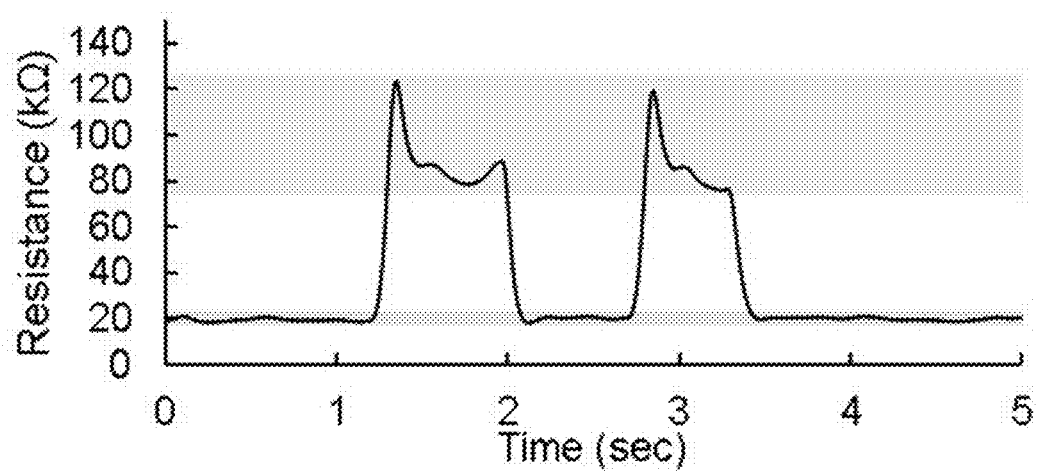
[Fig. 14B]
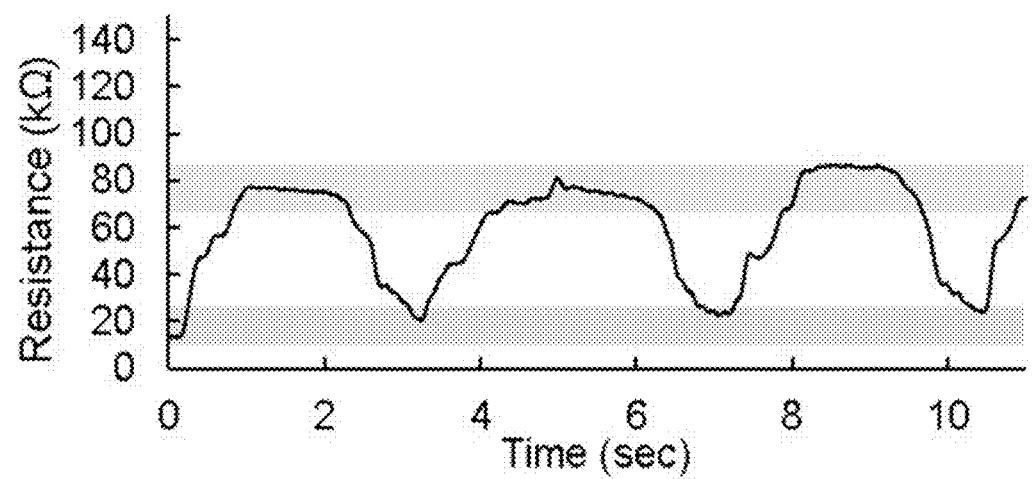

[Fig. 14C]
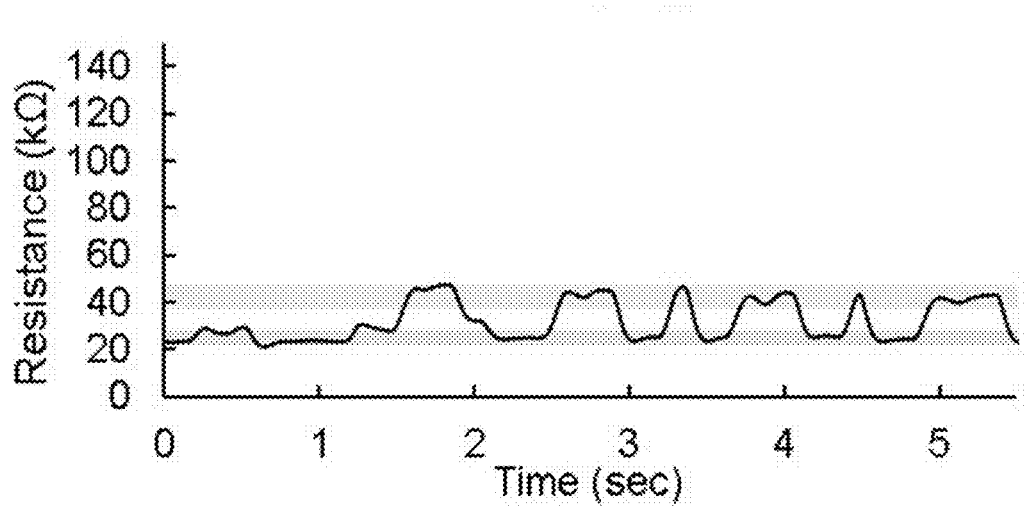

[Fig. 15]
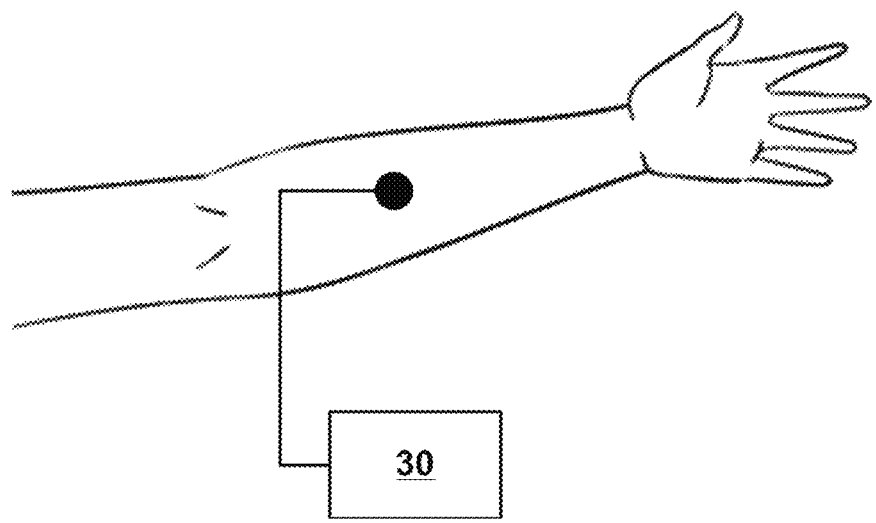

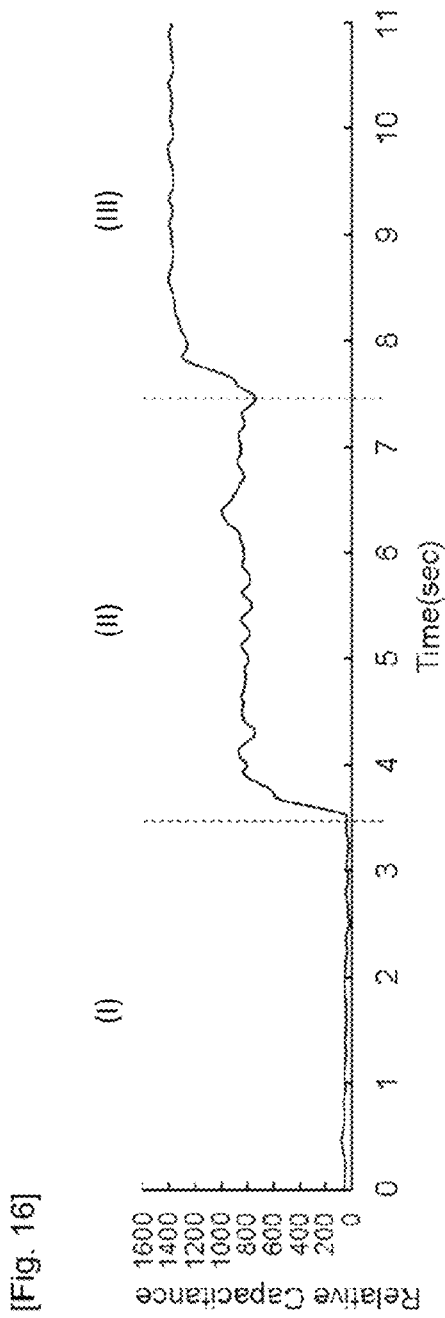
[Fig. 16]

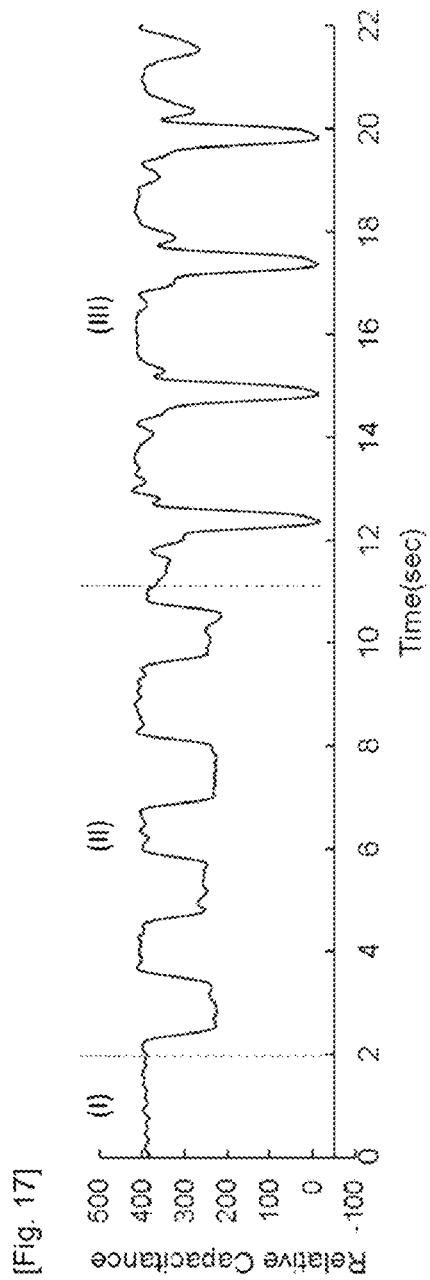
[Fig. 17]

[Fig. 18A]
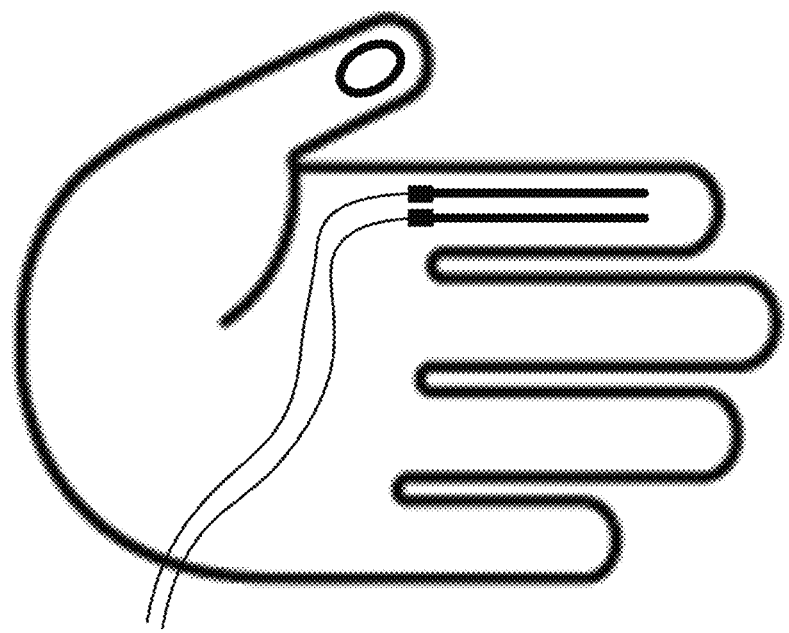

[Fig. 18B]
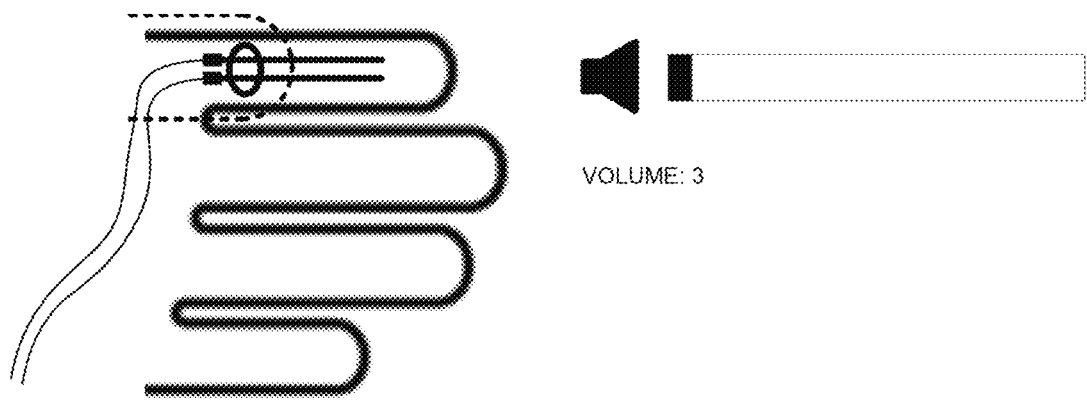
VOLUME: 3
[Fig. 18C]
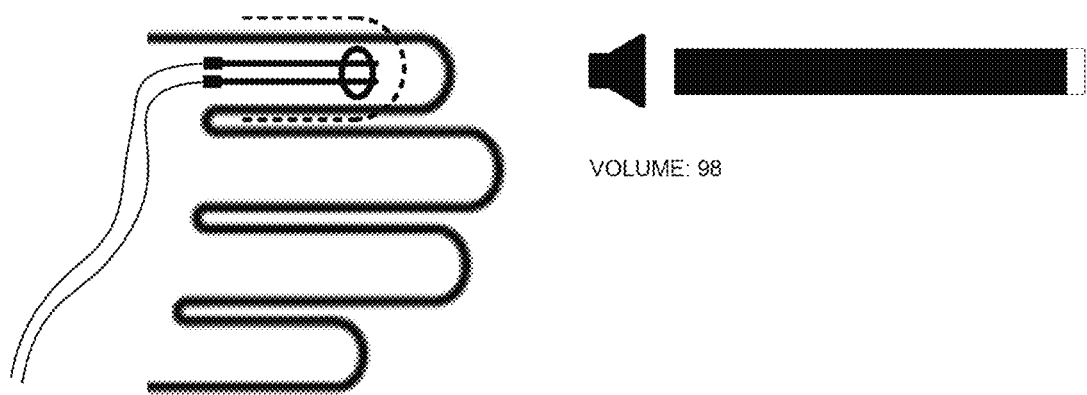
VOLUME: 98

[Fig. 19A]
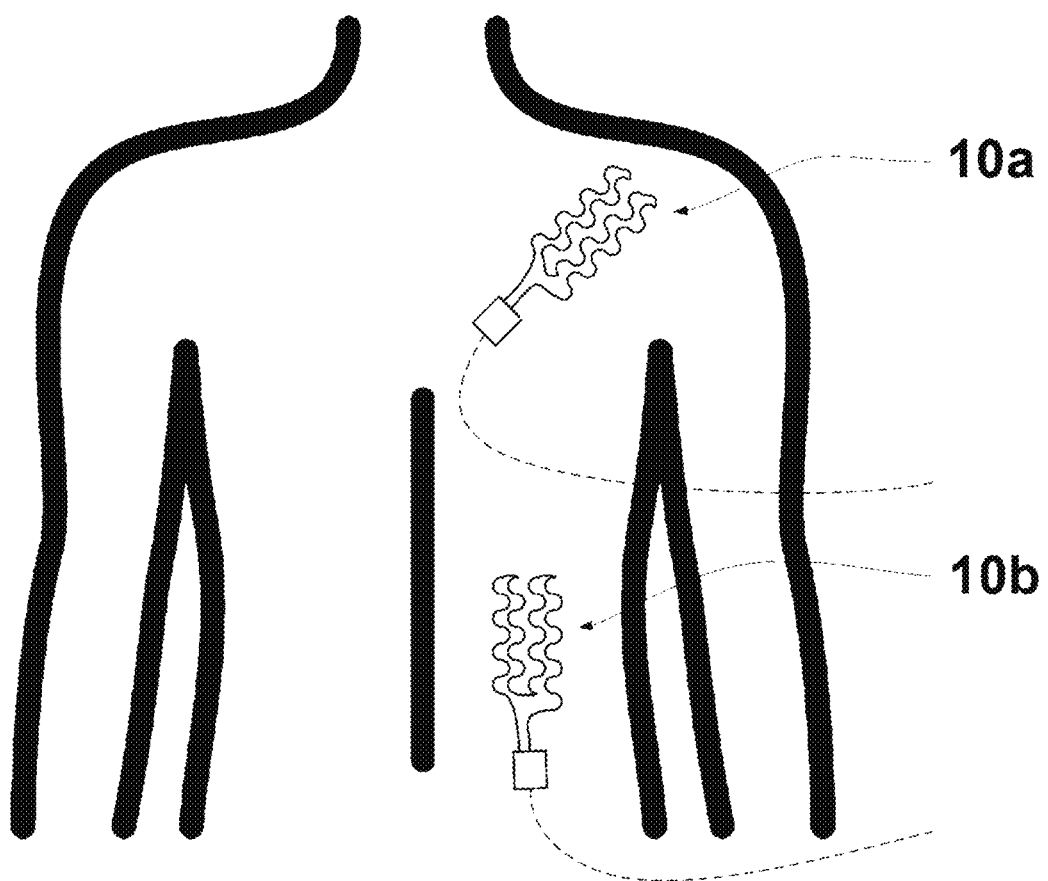

[Fig. 19B]
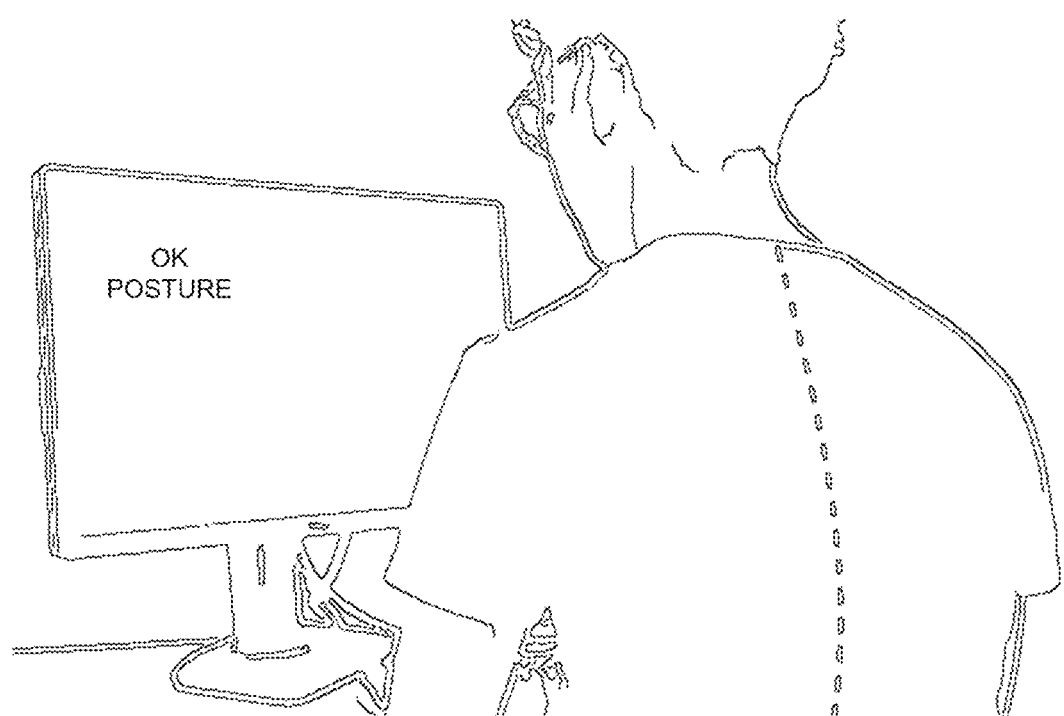

[Fig. 19C]
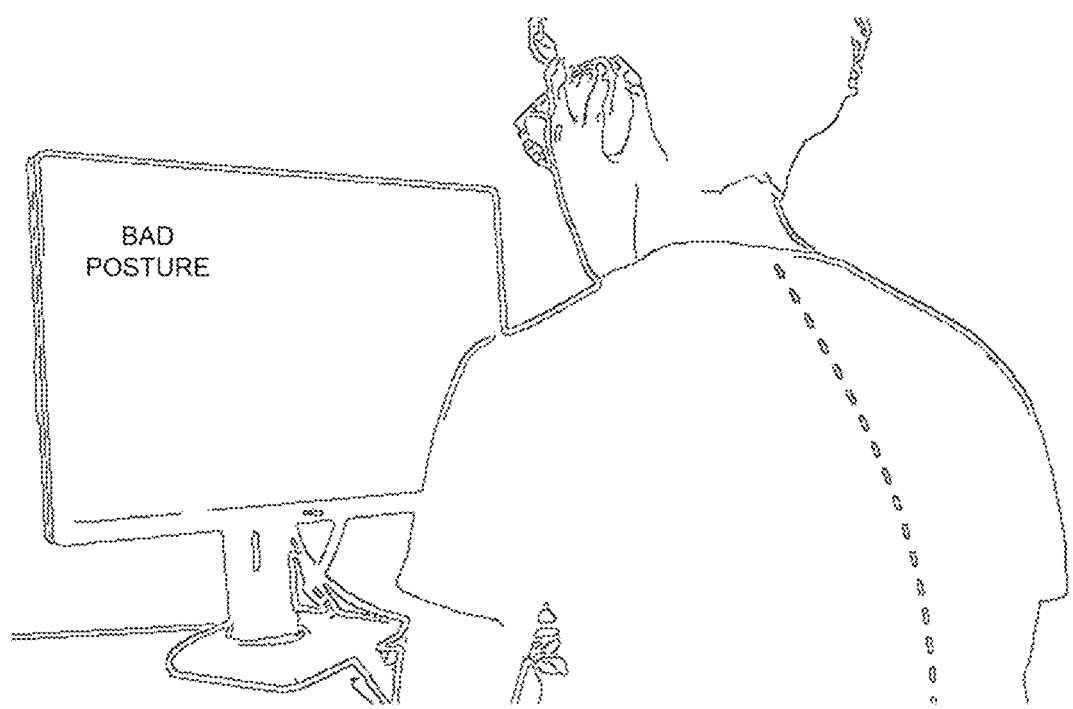

[Fig. 20A]
[Fig. 20B]
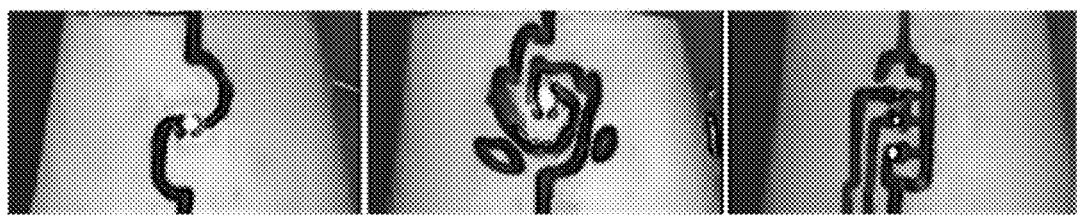

METHOD AND APPARATUS FOR PRINTING ELECTRICAL CIRCUIT DIRECTLY ON TARGET SURFACE HAVING 3-DIMENSIONAL SHAPE, 3D PRINTER USED FOR THE SAME AND ELECTRICAL DEVICE HAVING ELECTRICAL CIRCUIT PRINTED BY THE SAME

BACKGROUND OF THE INVENTION

1. Field of the Invention

The present invention relates to a method and apparatus for printing an electric circuit directly on a target surface having a three-dimensional shape, a 3D printing apparatus used therefor, and an electrical device having an electric circuit printed thereby.

2. Description of the Related Art

In Human-Computer Interface (HCI), on-body electronics are recognized as a new interface medium. Existing studies have developed technologies that enable on-body electronic fabrication by considering various wearability factors. Most of these technologies follow the same design and fabrication flow. The electronics are made as two-dimensional stickers or tattoos on a flat surface and later attached to the body. The manufacturing process usually requires several steps so that the conductive material can be attached to a flexible substrate and subsequently attached to the body. These manufacturing processes are inherently difficult and error-prone. This is because it usually takes several iterations to create a sticker and apply it correctly to the body as desired. More generally, there is a disconnect between the prototype and the final form of the circuit, since design and fabrication run in two-dimensional space whereas the body is essentially a three-dimensional surface.

There are a few studies that have shown the possibility of printing directly on the user's body, but these examples are largely limited by the type of ink used and the form factor of the printing device that allows printing only to a limited location on the human body.

SUMMARY OF THE INVENTION

An object of the present invention is to provide a fast and accessible method and apparatus capable of directly manufacturing an electric circuit on a target surface having a three-dimensional shape, such as skin in various body positions, in order to solve the above problems.

Another object of the present invention is to provide a 3D printing apparatus used in the above method.

Another object of the present invention is to provide an electronic device having a three-dimensional electric circuit manufactured by the above method.

In order to solve the above technical problem, according to an aspect of the present invention, there is provided a method for printing an electric circuit directly on a target surface having a three-dimensional shape using a three-dimensional printing apparatus, the method comprising: (a) receiving two-dimensional information about the shape of the electric circuit to be printed; (b) receiving information about the three-dimensional shape of the target surface; (c) generating three-dimensional information on the electric circuit to be printed by adjusting the two-dimensional information about the shape of the electric circuit to be printed on the basis of the information about the three-dimensional shape of the target surface; and, (d) generating a tool path for controlling the three-dimensional printing apparatus based on the three-dimensional information on the electric circuit to be printed which generated in the step (c).

According to another aspect of the present invention, there is provided an apparatus for printing an electric circuit directly on a target surface having a three-dimensional shape, comprising: at least one processor; and at least one memory for storing computer-executable instructions; wherein the computer-executable instructions stored in the at least one memory includes: (a) receiving two-dimensional information about the shape of the electric circuit to be printed; (b) receiving information about the three-dimensional shape of the target surface; (c) generating three-dimensional information on the electric circuit to be printed by adjusting the two-dimensional information about the shape of the electric circuit to be printed on the basis of the information about the three-dimensional shape of the target surface; and, (d) generating a tool path for controlling a three-dimensional printing apparatus based on the three-dimensional information on the electric circuit to be printed which generated in the step (c).

According to another aspect of the present invention, there is provided a 3D printing apparatus for printing an electric circuit along a given tool path directly on a target surface having a three-dimensional shape, comprising: an ink supply unit supplying conductive ink onto the target surface; a three-dimensional driving unit for moving the ink supply unit along the tool path; and, a control unit for controlling the operation of the ink supply unit and the three-dimensional driving unit, wherein the tool path is generated by adjusting two-dimensional information about the shape of the electric circuit based on information about the three-dimensional shape of the target surface.

According to another aspect of the present invention, there is provided an electronic apparatus, comprising: one or more electric circuits attached to an object surface having a three-dimensional shape; and, a control module connected to the one or more electric circuits, wherein the one or more electric circuits are formed by printing directly on the object surface.

According to another aspect of the present invention, there is provided a system for printing an electric circuit directly on a target surface having a three-dimensional shape, comprising: a 3D printing apparatus for printing the electric circuit directly on the target surface having a three-dimensional shape; a tool path generator for generating three-dimensional information about the electric circuit by adjusting two-dimensional information about the shape of the electric circuit based on the information about the three-dimensional shape of the target surface and generating a tool path based on the three-dimensional information about the electric circuit; and, a printing apparatus control module for controlling the operation of the 3D printing apparatus according to the tool path.

In accordance with the present invention, a fast and accessible method and apparatus for fabricating electrical circuits directly on a target surface having a three-dimensional shape are provided.

Also provided is a three-dimensional printing apparatus used in the method according to the present invention.

Also provided is an electronic device having a three-dimensional electric circuit manufactured by the method according to the present invention.

BRIEF DESCRIPTION OF THE DRAWINGS

FIG. 1 is a diagram schematically showing a 3D electric circuit printing system according to an embodiment of the present invention.

FIG. 2 is a diagram illustrating a printing apparatus control module in the system shown in FIG. 1.

FIG. 3 is a diagram illustrating a tool path generating apparatus in the system shown in FIG. 1.

FIG. 4 is a flow chart illustrating a method performed by the system shown in FIG. 1.

FIG. 5 is a diagram schematically illustrating a state in which an electric circuit is printed on a user's arm using the system shown in FIG. 1.

FIG. 6 is a diagram schematically illustrating an electric circuit printed on two parts of a user's arm and an electronic device having the same.

FIG. 7 is a diagram illustrating a control module in the electronic device shown in FIG. 6.

FIG. 8 is a diagram illustrating a computer connected to the electronic device shown in FIG. 6.

FIGS. 9A and 9B are diagrams illustrating output screens according to an application example of the electronic device illustrated in FIG. 6.

FIG. 10 is a diagram illustrating a 3D printing apparatus according to an embodiment of the present invention.

FIG. 11 shows a formula for correcting a 2D tool path into a 3D tool path in a system using the 3D printing apparatus shown in FIG. 10.

FIGS. 12A and 12B show graphic interfaces of a system using the 3D printing apparatus shown in FIG. 10.

FIG. 13 is a diagram illustrating a state in which electric circuits are printed on various parts of the human body using the 3D printing apparatus shown in FIG. 10.

FIGS. 14A to 14C show outputs according to various motions of an arm as an application example of an electronic device according to the present invention.

FIG. 15 shows a state in which a capacitance electric circuit is printed on a user's arm.

FIG. 16 is another application example of the electronic device according to the present invention, showing an output according to contact with another person.

FIG. 17 shows outputs according to various operations as another application example of the electronic device according to the present invention.

FIGS. 18A to 18C show the operation of the slider controller as another application example of the electronic device according to the present invention.

FIGS. 19A to 19C show another application example of an electronic device according to the present invention, in which output is changed according to a user's posture quality.

FIGS. 20A and 20B show various LED displays printed on a user's skin as another application example of the electronic device according to the present invention.

DETAILED DESCRIPTION OF THE INVENTION

Hereinafter, exemplary embodiments of the present invention will be described in detail with reference to the accompanying drawings. Prior to the description of the present invention, it will be noted that the terms and wordings used in the specification and the claims should not be construed as general and lexical meanings, but should be construed as the meanings and concepts that agree with the technical spirits of the present invention, based on the principle stating that the concepts of the terms may be properly defined by the inventor(s) to describe the invention in the best manner. Therefore, because the examples described in the specification and the configurations illustrated in the drawings are merely for the preferred embodiments of the present invention but cannot represent all the technical sprints of the present invention, it should be understood that various equivalents and modifications that may replace them can be present.

FIG. 1 schematically shows a system for printing an electric circuit directly on a target surface having a three-dimensional shape according to an embodiment of the present invention, and FIG. 2 shows a control module for controlling the operation of the 3D printing apparatus, and FIG. 3 shows a tool path generating apparatus for generating a tool path for printing an electric circuit on a target surface using the 3D printing device shown in FIG. 1.

As shown, the 3D electric circuit printing system 1 includes a 3D printing apparatus 100, a printing apparatus control module 200, and a tool path generating apparatus 300.

The 3D printing apparatus 100 supplies a conductive ink on a target surface having a three-dimensional shape to form a trace of the conductive ink. The conductive ink may be a commercially available material, and it is preferable to have a property of being able to flow during printing and curing after printing.

The 3D printing apparatus 100 includes an ink supply unit 120 for supplying conductive ink to a target surface and a 3D driving unit 110 for moving the ink supply unit 120 along a 3D tool path. The ink supply unit 120 supplies the conductive ink on the target surface while moving by the 3D driving unit 110. The ink supply unit 120 may control the amount of conductive ink supplied on the target surface. As the ink supply unit 120, for example, an extruder, a brush, or any other device capable of supplying conductive ink to a target surface having a three-dimensional shape may be used. The 3D driving unit 110 may be, for example, a Cartesian platform that independently moves the ink supply unit 120 in three directions orthogonal to each other. The 3D printing apparatus 100 preferably maintains a state attached to the target surface while printing is performed in order to ensure good printing of the electric circuit.

The printing apparatus control module 200 controls the operation of the 3D printing apparatus 100. The printing apparatus control module 200 controls the operations of the 3D driving unit 110 and the ink supply unit 120 of the 3D printing apparatus 100 according to a given tool path. The printing apparatus control module 200 may be, for example, an electronic device having a microcontroller such as Arduino. FIG. 2 schematically shows an embodiment of the printing apparatus control module 200. The printing apparatus control module 200 includes the processor 210, the memory 220 storing programs being executed, an input/output unit 230 inputs or outputs information between the 3D printing apparatus 100 or a tool path generating apparatus 300 to be described later, and internal communication paths therebetween. In the present embodiment, a control program for controlling the 3D printing apparatus 100 is loaded in the memory 220, and the 3D printing apparatus 100 is controlled by the control program. The control program may be provided to the printing apparatus control module 200 from the outside through the input/output unit 230. A non-volatile memory (not shown) for storing the provided control program may be additionally provided. Also, the tool path may be transmitted from the tool path generating apparatus 300 through the input/output unit 230. The 3D printing apparatus control program mounted in the memory 220 of the printing apparatus control module 200 generates a signal to control the ink supply unit 120 and the 3D driving unit 110 of the 3D printing apparatus 100 based on the received tool path. The signal for controlling the 3D printing apparatus 100 is transmitted to the 3D printing apparatus 100 through the input/output unit 230

FIG. 3 schematically shows a tool path generating apparatus 300. The tool path generating apparatus 300 may be, for example, a computer. The tool path generating apparatus 300 includes a processor 310, a non-volatile storage unit 320 for storing programs and data, etc., a volatile memory 330 for storing programs being executed, and an input/output unit 340 for inputting and outputting information between a user, a user interface 350, and internal communication paths therebetween. The running program may include an operating system and various applications. Although not shown, it includes a power supply unit. In the present embodiment, a tool path generating program is loaded in the memory 330, thereby generating a tool path for controlling the 3D printing apparatus 100. The generated tool path is transmitted to the printing apparatus control module 200 through the input/output unit 340, and the printing apparatus control module 200 generate a signal for controlling the 3D printing apparatus 100 based on the received tool path.

FIG. 4 illustrates a process performed by a computer program for generating a tool path of the tool path generating apparatus 300. In the illustrated embodiment, tool path generator program receives two-dimensional information about the shape of the electrical circuit to be printed and information about the three-dimensional shape of the target surface are input, generates three-dimensional information on the electrical circuit to be printed by adjusting the two-dimensional information about the shape of the electrical circuit to be printed based on the information about the three-dimensional shape of the target surface, and, based on the generated three-dimensional information, generates a tool path is created. Information on the shape of the electrical circuit to be printed may be input through the input/output unit 340 from the outside of the apparatus or may be input through the user interface 350. The input information may be stored in the non-volatile storage unit 320. The information on the shape of the electrical circuit to be printed may be any information that can define the two-dimensional shape of the electrical circuit. For example, it may be simple spatial coordinate information about an electric circuit, or it may be two-dimensional tool path information. In addition, the tool path generating apparatus 300 receives information about the three-dimensional shape of the target surface on which the electric circuit is to be printed. This information may be input using, for example, the 3D printing apparatus 100, or may be input using an external device (not shown) such as a camera or a laser scanner. Finally, three-dimensional information about the electric circuit to be printed is generated by adjusting the two-dimensional information about the shape of the electric circuit to be printed on the basis of the information about the three-dimensional shape of the target surface, and based on this, creates a toolpath to control the 3D printing apparatus. The adjusting process may be performed, for example, by projecting two-dimensional information regarding the shape of the electrical circuit to be printed onto a target surface having a three-dimensional shape to obtain additional information about each point of the electrical circuit. When the three-dimensional information on the electrical circuit to be printed is obtained by the adjusting operation, a tool path for controlling the 3D printing apparatus is generated based on the obtained three-dimensional information.

FIG. 5 shows a state in which an electric circuit is printed using the 3D electric circuit printing system 1 shown in FIG. 1 at the concave point of the user's elbow. In the illustrated embodiment, for convenience of explanation, the 3D printing apparatus 100, the printing apparatus control module 200, and the tool path generating apparatus 300 are each illustrated and described as separate apparatuses, but these apparatuses may also be combined with each other. For example, the 3D printing apparatus 100 and the printing apparatus control module 200 are combined to form one apparatus, or the printing apparatus control module 200 and the tool path generating apparatus 300 are combined to form one apparatus.

FIG. 6 shows an example of an electronic device printed by the 3D electric circuit printing system 1 in FIG. 5. In the illustrated embodiment, an electric circuit is printed on the concave point of the user's elbow and the wrist. In this embodiment, each electronic device is configured to operate as a strain gauge. Since the two electronic devices differ only in size and have the same technical configuration, only the electronic device disposed on the elbow will be described below and the description of the electronic device disposed on the wrist will be omitted.

The electronic device includes an electric circuit 10 printed by the 3D electric circuit printing system 1 described above, electric elements 21 and 22 connected to the electric circuit 10, and a control module 30 electrically connected to the electric circuit, and an insulating layer 40 attached to the user's skin. Reference numeral 400 denotes a computer and is connected to the control module 30.

The electric circuit 10 is printed directly on the user's skin by the 3D electric circuit printing system 1 shown in FIG. 1 by the method described above. In the illustrated embodiment the electrical circuit 10 is printed in a serpentine pattern. The electric circuit 10 is formed by being printed with a conductive ink having fluidity and then cured. In the cured state, the electric circuit has elasticity and flexibility.

Preferably, in order to provide electrical insulation to increase safety and improve adhesion of the electrical circuit, the insulating layer 40 is first attached to the user's skin, and then the electric circuit 10 may be printed thereon. In addition, an insulating layer (not shown) may be additionally attached on the electric circuit 10 to insulate between the electric circuit 10 and other objects. The durability of the electric circuit 10 may also be increased thereby. The insulating layer 40 may be formed using, for example, a liquid bandage such as Nexcare manufactured by 3M, which is commercially available.

The electronic device may include electric elements 21 and 22 electrically connected to the electrical circuit 10. In the illustrated embodiment, a resistance element 21 and a connector 22 are connected to the electrical circuit 10. Since the electric circuit 10 has elasticity and flexibility, it is deformed together with the skin at the point where the electric circuit 10 is attached. The resistance element 21 is provided so that the illustrated electronic device operates as a voltage divider, and the connector 22 is provided to connect the electric circuit 10 with the control module 30. In the illustrated embodiment, the electronic device operates as a strain gauge, converts the strain applied to the skin according to the user's change of the arm posture into an electrical signal, and provides it to the control module 30.

The control module 30 is electrically connected to the electric circuit 10, and receives and processes electric signals from the electric circuit 10 or operates the electric circuit 10. The control module 30 may be, for example, an electronic device having a microcontroller such as Arduino. FIG. 7 shows an embodiment of the control module 30. The control module 30 includes a processor 31, a memory 32 for storing programs being executed, an input/output unit 33 for inputting or outputting information between an electric circuit 10 or a computer 400 to be described later, and an internal communication paths therebetween. In this embodiment, the memory 32 is loaded with a control program for controlling the electric circuit 10, and the signal of the electric circuit 10 is processed or the electric circuit 10 is operated by the control program. In the illustrated embodiment, when the user changes the posture of the arm, the control module 30 may detect this through a change in the resistance of the electric circuit 10.

For a richer application, the control module 30 may cooperate with the computer 400. FIG. 8 shows a computer 400 cooperating with the control module 30. The computer 400 includes a processor 410, a non-volatile storage unit 420 for storing programs and data, etc., a volatile memory 430 for storing programs being executed, and an input/output unit 440 for inputting and outputting information between the user, a user interface 450, and an internal communication paths therebetween. In the illustrated embodiment, an application program is loaded in the volatile memory 430 of the computer 400. The application program may process the electrical signal received from the control module 30 and provide it in a form for the user to understand. For example, the application program may receive from the control module 30 a change in resistance of an electric circuit disposed on the elbow and wrist according to a change in the posture of the user's arm and display it graphically on the screen. The application program applies a low-pass filter to the electrical signal provided from the control module 30 and maps it to the rotation angle of the joint of the simplified skeletal model. The graphical user interface renders the arm movements on the screen in real time. FIGS. 9A and 9B show an example of a graphical user interface provided by an application program of the computer 400. FIG. 9A shows a posture when the user slightly bends the elbow, and FIG. 9B shows a state in which the user bends the elbow by about 90 degrees and slightly bends the wrist.

Examples

Hereinafter, an embodiment of the 3D electric circuit printing system described above with reference to the drawings will be described.

FIG. 10 shows a 3D printing apparatus according to the present embodiment. The 3D printing apparatus 100 has a structure in which the ink extruder 120 is mounted on the Cartesian plotter base 110. The 3D printing apparatus 100 includes a total of four bipolar stepper motors 114a, 114b, 115 and 116. Two stepper motors 114a and 114b respectively connected to the screw rod are mounted on the edge of the Cartesian plotter base 110 to move the ink extruder 120 in the x-axis direction. Two additional stepper motors 115 and 116 and their associated screw rods move the extruder in the y-axis and z-axis directions, respectively. The maximum resolution of motion in the xy plane is 0.3 mm and the maximum velocity is 8.3 mm/s. The resolution of the Z-axis is 0.1 mm. The ink extruder 120 is mounted on the head of the plotter. The head of the plotter consists of a geared DC motor 123 and a screw rod and is used to extrude ink. The ink extruder 120 has a plunger attached to a nut and connected to a screw rod driven by a motor. The size of the nozzle 122 of the ink extruder 120 is 00.5 mm, and the ink contained in the extruder barrel 121 is extruded. Barrel 121 contains up to 1.5 mL of commercially available, skin-safe conductive ink. All parts of the Cartesian plotter base 110 and the ink extruder 120 are manufactured by a three-dimensional printing method, and the overall size is 120× 80×140 mm, and the print area has a size of 74×39 mm.

Through the holes 111a, 111b, 111c provided in the Cartesian plotter base 110, a mechanism such as a string for fixing the 3D printing apparatus to the target surface is disposed.

The control module contains an Arduino Uno microcontroller, a CNC Arduino shield V3 with four A4988 stepper motor drivers, and one L293D H-bridge integrated circuit. The entire system is powered via an 8V DC power supply. The Arduino Uno runs the CNC software and is used to control the position of the ink extruder 120 with a motor. In particular, the two stepper motors 114a, 114b disposed along the x-axis are synchronized so as not to be structurally twisted along the y-axis. The H-bridge IC chip is on a separate breadboard (45 mm×35 mm) and controls the depth and direction of motion of the plunger in the ink extruder 120. Normally the plunger is pushed out to eject the ink, but it can also be pulled when the extruder needs to be refilled or there are deliberate gaps in the circuit. The tool path generating program is written in Java and runs on the PC.

The user designs the desired electrical circuit using CAD software. After completion, the electrical circuit is converted into a tool path and exported as a two-dimensional G-code. The user loads the generated G-code using a tool path generating program and then visualizes it as a two-dimensional toolpath. Any required additions to the circuit can be implemented directly using the mouse click and drag gestures.

Next, the user puts on the 3D printing apparatus 100 and starts computer-assisted z-axis calibration. After setting the calibration grid resolution, the user moves the ink extruder 120 to each calibration point and adjusts the z-axis values. The tool path generating program integrates the z-axis data into the imported two-dimensional G-code and transforms it into a three-dimensional tool path that is sent to the hardware control unit. Calibration requires manual adjustment of the vertical height of the ink extruder 120 at each point until the ink extruder 120 touches the skin. Only points close to the circuit need calibration. During calibration, the ink extruder 120 can move with a precision of 0.1 mm and a speed of 8.3 mm/s. Calibration points are the result of subdividing the print area into any number of rows and columns between 6 and 11, depending on the complexity of the body part to be printed. Given a limited set of calibration points, the shape of the print surface can be inferred. The equidistant vertices due to the subdivision constitute the correction points. Therefore, a calibration grid consisting of a minimum of 36 vertices and a maximum of 121 vertices is supported. At full resolution, the calibration points are 6.7 mm and 3.6 mm apart in the x and y directions, respectively. All points within the region divided by these four vertices (Q11 to Q22) can be calculated using the formula in FIG. 11, which shows the bilinear interpolation for the height of the trace f at the point (x, y). For relatively fat body parts, using 6×6 points for calibration is sufficient and takes less than 5 minutes to complete. Once calibration is complete, the user can adjust the ink extruder settings to control the thickness of the printed traces.

The graphical interface of the tool path generating program is shown in FIGS. 12A and 12B. The graphical interface displays the circuits corresponding to the two-dimensional G-code commands loaded by the tool path generating program (see FIG. 12A). Users can draw custom shapes that can be printed together. The graphical interface shows the numerical values of the z-axis displayed as a grid overlay over the tool path (see FIG. 12B). On the right side of the screen is a control panel with buttons and sliders. This panel allows precise control of the operations of the 3D printing apparatus such as: 1) moving the nozzle in one of three axes, 2) print initialization, calibration and start, 3) moving vertically the plunger of the extruder to fill the extruder or extrude the ink, and 4) setting the thickness of the printed circuit. For example, setting the plunger to full force (100% duty cycle) will print a line approximately 2 mm thick.

Finally, the tool path generating program uses the height of each vertex combined with the 2D G-code information to construct a new path including the coordinates of the electric circuit along with the height value of the body surface in three dimensions. A set of three-dimensional G-code commands is entered into the control module and used to control the position of the extruder in three axes.

Pressing the "PRINT" button in the graphical interface starts printing the circuit. The ink extruder moves along the curvature of the skin according to the generated three-dimensional tool path. After printing is complete, the user can remove the 3D printing device from the skin surface and prepare the circuit wiring with the necessary components. Printed circuits typically dry in less than 10 minutes, during which time the necessary electronic components are attached to the circuit.

The user can apply a liquid band to the skin of the desired printed area to insulate the electric circuit, thereby improving skin safety and improving the adhesion of the electric circuit. This also results in long lasting of the printed circuit. When the electrical circuit dries, an additional layer of liquid band is applied to further insulate the circuit and increase its durability.

The 3D electric circuit printing system according to the present embodiment can print electric circuits on various parts of the human body. Referring to FIG. 13, in a clockwise direction from the upper left, an electric circuit could be printed on areas such as forearms, wrists, fingers, forehead, neck, back, stomach, thighs, and ankles.

FIGS. 14 to 20 show various electronic devices including an electric circuit printed on a body part by the 3D electric circuit printing system according to the present embodiment and application examples thereof.

FIGS. 14A to 14C show, respectively, that various input gestures such as bending, twisting, and gripping the skin of an electric circuit part can be detected by the strain gauge printed on the concave part of the elbow. The graphs show how strongly the resistance changes according to the bending, twisting, and gripping input motions.

FIG. 15 shows an example of an electronic device for measuring capacitance. Using the CapactiveSensor library and the printed sensor's known 1 MΩ resistor, the time required to charge the capacitor was measured with the control module. This electronic device was used to create two simple applications shown in FIGS. 16 and 17. When the user touches another person, the relative capacitance increases. As shown in FIG. 16, the relative capacitance appears differently, when the user is in a non-contact state with another person (I), when the index finger is in contact with another person (II), and when the middle finger is in contact with another person (III), respectively. This application demonstrates reliable detection of each other's touch. As the contact area between the user and ground decreases, the body capacitance decreases accordingly. The second application uses this to show motion detection such as standing (I), walking (II), and jumping (III). Depending on these applications, it is easy to imagine other opportunities for different types of detection, such as step counters, fitness trackers, etc.

In the application shown in FIG. 18, a slider controller is printed on the user's finger using the concept of a voltage divider. Two parallel lines cross the index finger, while a circular switch is printed on the thumb. When your thumb touches the slider's rail, it effectively closes the circuit, allowing the control module to sense the corresponding resistance between the start of the slider and where the touch occurred. We then mapped this value to the volume level of the music player.

In the application example shown in FIG. 19, the quality of the user's sitting posture was detected using two strain gauge sensors. Electric circuits are printed on the upper 10a and lower back 10b and their combined readings are used to infer the user's posture and provide visual feedback to the user. This application also shows how to cover electric circuits with clothing without causing interference.

Using the 3D electric circuit printing system according to the present embodiment, it is possible to make a functional and aesthetically satisfactory LED display. FIG. 20A shows a flame tattoo printed on the forehead with 6 LEDs to create an animation effect. The LEDs are individually controlled using charlieplexing, and up to eight (8) LEDs can be controlled with three wires connected to the control module. FIG. 20B shows various examples of LED displays printed on the forearm.

The foregoing detailed description should not be construed as restrictive in any way but as illustrative. For example, in the specification of the present invention, it has been described that an electric circuit is printed on the skin of the human body as an embodiment. The target surface is not limited to the skin of the human body, and any surface to which the 3D printing apparatus can be attached may be the target surface. The scope of the present invention should be determined by a reasonable interpretation of the appended claims, and all modifications within the equivalent scope of the present invention are included in the scope of the present invention.

What is claimed is:

1. A method for printing an electric circuit directly on a target surface having a three-dimensional shape using a three-dimensional printing apparatus, the method comprising:
    (a) receiving two-dimensional information about the shape of the electric circuit to be printed;
    (b) receiving information about the three-dimensional shape of the target surface;
    (c) generating three-dimensional information on the electric circuit to be printed by adjusting the two-dimensional information about the shape of the electric circuit to be printed on the basis of the information about the three-dimensional shape of the target surface; and,
    (d) generating a tool path for controlling the three-dimensional printing apparatus based on the three-dimensional information on the electric circuit to be printed which generated in the step (c).

2. The method according to claim 1, wherein the target surface is a human skin surface.

3. The method according to claim 1, wherein the target surface is a surface of an insulating layer attached to the human skin before the electric circuit is printed thereon.

4. The method according to claim 1, further comprising the step of:
    (e) supplying conductive ink on the target surface along the tool path generated in step (d).

5. The method according to claim 4, further comprising the step of:
    (f) disposing an electrical element electrically connected to the electric circuit to be printed on the target surface.

6. An apparatus for printing an electric circuit directly on a target surface having a three-dimensional shape, comprising:
- at least one processor; and
- at least one memory for storing computer-executable instructions;
- wherein the computer-executable instructions stored in the at least one memory includes:
  - (a) receiving two-dimensional information about the shape of the electric circuit to be printed;
  - (b) receiving information about the three-dimensional shape of the target surface;
  - (c) generating three-dimensional information on the electric circuit to be printed by adjusting the two-dimensional information about the shape of the electric circuit to be printed on the basis of the information about the three-dimensional shape of the target surface; and,
  - (d) generating a tool path for controlling a three-dimensional printing apparatus based on the three-dimensional information on the electric circuit to be printed which generated in the step (c).

7. The apparatus according to claim 6, further comprising a three-dimensional printing apparatus control module for generating a signal for controlling operations of the three-dimensional printing apparatus based on the tool path.

8. A 3D printing apparatus for printing an electric circuit along a given tool path directly on a target surface having a three-dimensional shape, comprising:
- an ink supply unit supplying conductive ink onto the target surface;
- a three-dimensional driving unit for moving the ink supply unit along the tool path; and,
- a control unit for controlling the operation of the ink supply unit and the three-dimensional driving unit,
- wherein the tool path is generated by adjusting two-dimensional information about the shape of the electric circuit based on information about the three-dimensional shape of the target surface.

9. The 3D printing apparatus according to claim 8, wherein the ink supply unit is an extruder that holds and extrudes the conductive ink.

10. The 3D printing apparatus according to claim 8, wherein the three-dimensional driving unit is capable of maintaining a state of attachment to the target surface while printing.

11. A system for printing an electric circuit directly on a target surface having a three-dimensional shape, comprising:
- a 3D printing apparatus for printing the electric circuit directly on the target surface having a three-dimensional shape;
- a tool path generator for generating three-dimensional information about the electric circuit by adjusting two-dimensional information about the shape of the electric circuit based on the information about the three-dimensional shape of the target surface and generating a tool path based on the three-dimensional information about the electric circuit; and,
- a printing apparatus control module for controlling the operation of the 3D printing apparatus according to the tool path.

* * * * *